(12) United States Patent
Matsumoto

(10) Patent No.: US 8,471,670 B2
(45) Date of Patent: Jun. 25, 2013

(54) FUSIBLE LINK UNIT

(75) Inventor: Yusuke Matsumoto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 70 days.

(21) Appl. No.: 12/786,964

(22) Filed: May 25, 2010

(65) Prior Publication Data

US 2010/0328018 A1    Dec. 30, 2010

(30) Foreign Application Priority Data

Jun. 29, 2009    (JP) .............................. P. 2009-153794

(51) Int. Cl.
*H01H 85/04*    (2006.01)
*H01H 85/02*    (2006.01)
*H01H 69/02*    (2006.01)
*H01H 85/143*    (2006.01)

(52) U.S. Cl.
USPC ............ 337/187; 337/295; 337/227; 337/159; 29/623

(58) Field of Classification Search
USPC ..................... 337/187, 295, 159, 227; 29/623
See application file for complete search history.

(56) References Cited

U.S. PATENT DOCUMENTS

| | | | | |
|---|---|---|---|---|
| 3,995,103 | A * | 11/1976 | Gehrs et al. ................. | 174/72 B |
| 4,599,679 | A * | 7/1986 | Baader .......................... | 361/648 |
| 5,977,859 | A * | 11/1999 | Kawamura et al. ............ | 337/295 |
| 6,509,824 | B2 * | 1/2003 | Inaba et al. ..................... | 337/295 |
| 6,566,599 | B2 * | 5/2003 | Sumida et al. .................. | 174/50 |
| 6,759,938 | B2 * | 7/2004 | Matsumura et al. ............ | 337/161 |
| 6,824,430 | B2 * | 11/2004 | Matsumura et al. ...... | 439/620.29 |
| 6,830,482 | B2 * | 12/2004 | Matsumura et al. ...... | 439/620.27 |
| 7,071,808 | B2 * | 7/2006 | Nakamura ..................... | 337/256 |
| 7,592,892 | B2 * | 9/2009 | Ito et al. ......................... | 337/159 |
| 7,612,647 | B2 * | 11/2009 | Onoda et al. ................... | 337/229 |
| 7,663,465 | B2 * | 2/2010 | Matsumoto et al. ........... | 337/187 |
| 7,978,046 | B2 * | 7/2011 | Ohashi et al. .................. | 337/186 |
| 2001/0011939 | A1 * | 8/2001 | Inaba et al. ..................... | 337/265 |
| 2002/0167390 | A1 * | 11/2002 | Matsumura et al. ........... | 337/161 |
| 2004/0032703 | A1 * | 2/2004 | Ikeda .............................. | 361/104 |
| 2004/0124963 | A1 * | 7/2004 | Nakamura ...................... | 337/256 |
| 2004/0130430 | A1 * | 7/2004 | Matsumura et al. ............ | 337/181 |
| 2005/0285709 | A1 * | 12/2005 | Matsumura et al. ............ | 337/227 |
| 2007/0241857 | A1 * | 10/2007 | Ito et al. ......................... | 337/187 |
| 2008/0050981 | A1 * | 2/2008 | Pavlovic et al. ............... | 439/701 |
| 2009/0068894 | A1 * | 3/2009 | Ohashi et al. ............. | 439/620.26 |
| 2009/0108982 | A1 * | 4/2009 | Ohashi et al. .................. | 337/191 |
| 2009/0253311 | A1 * | 10/2009 | Akahori et al. ................ | 439/709 |
| 2011/0095859 | A1 * | 4/2011 | Shibata .......................... | 337/283 |

FOREIGN PATENT DOCUMENTS

JP    2004-186005    7/2004

* cited by examiner

*Primary Examiner* — Bradley Thomas
(74) *Attorney, Agent, or Firm* — Finnegan, Henderson, Farabow, Garrett & Dunner, L.L.P.

(57) ABSTRACT

A fusible link unit includes a fuse busbar and a housing. The fuse busbar includes a first busbar having a first input connecting portion; a second busbar having a second input connecting portion; and a fusible element provided between the first busbar and the second busbar. The housing is provided with the fuse busbar. The fusible element is configured to melt down when a current of a predetermined value is conducted therethrough. The first input connecting portion and the second input connecting portion are formed into the same shape. The first and second input connecting portions are passed through inserting holes, which are provided on both end portions of the housing, and are projected outwards. The housing is formed symmetrical transversely.

8 Claims, 12 Drawing Sheets

FUSIBLE LINK UNIT

BACKGROUND

The present invention relates to a fusible link unit which cuts off an overcurrent flowing in an electric circuit.

A battery is installed in, for example, a vehicle, which is a mobile unit, as a power supply for supplying electric power to various types of electronic devices installed in the vehicle. Electric wires connected to the electronic devices are electrically connected to the battery via a fusible link unit, for example, so that electric power is supplied from the battery to the electronic equipment. The fusible link unit distributes electric power from the battery to the individual electronic devices and prevents the supply of excessive electric power to the electronic devices.

As a fusible link unit like this, there has been proposed a fusible link unit which can deal with changes in the numbers of terminals of fuse busbars on a battery side and an alternator side which change with model type and grade with as small a change in design as possible by branching currents conducted from the alternator side and the battery side via fuses (for example, refer to Patent Document 1).

[Patent Document 1] JP-A-2004-186005

With the related fusible link unit that has been described above, however, in the event that the input direction from the alternator is changed due to conditions on the vehicle side, in order to deal with the change in input direction from the alternator, although the fuse busbars and output form (the numbers of connectors and terminals) remain the same, two types of fusible link units have to be prepared separately. Because of this, the number of components is increased and the number of steps to control the components is increased, leading to a problem that the production costs become high eventually.

SUMMARY

Then, the invention has been made with a view to solving the problem inherent in the related art, and an object thereof is to provide a fusible link unit which can deal with a change in input direction on an alternator side due to conditions on a vehicle side with one configuration, to thereby realize a reduction in production cost.

In order to achieve the above object, according to the present invention, there is provided a fusible link unit comprising:

a fuse busbar that includes:
a first busbar having a first input connecting portion;
a second busbar having a second input connecting portion; and
a fusible element provided between the first busbar and the second busbar; and
a housing that is provided with the fuse busbar,
wherein the fusible element is configured to melt down when a current of a predetermined value is conducted therethrough;
wherein the first input connecting portion and the second input connecting portion are formed into the same shape;
wherein the first and second input connecting portions are passed through inserting holes, which are provided on both end portions of the housing, and are projected outside of the housing; and
wherein the housing is formed symmetrical transversely.

Preferably, a first slit and a second slit are formed in the first busbar and the second busbar respectively, the first input connecting portion is configured to be bent with respect to a conductive portion of the first busbar by the first slit, and the second input connecting portion is configured to be bent with respect to a conductive portion of the second busbar by the second slit.

Preferably, the first and second busbars have output connecting portions respectively. Each of the output connecting portions includes a terminal connecting portion which is connected to a mating terminal, and a connector connecting portion which is connected to a mating terminal accommodated in a connector. The housing includes a terminal supporting portion into which the terminal connecting portion is inserted, and a connector opening portion which is fitted with the connector accommodating the mating terminal.

Preferably, the housing has a locking portion which is adapted to be locked on an inner wall of a relay box in which the housing is accommodated.

Preferably, the fuse busbar is contained in the housing.

Preferably, the fuse busbar is embedded in the housing.

According to the above configuration, in the case of the fuse busbar being symmetrical transversely, even if an input terminal on the alternator side is arranged in different direction from an assuming direction, the fuse busbar can be deal with by changing the portion where the second input connecting portion of the second busbar, which projects outwards from the side portion of the housing, is bent without changing the configuration of the fusible link unit.

In addition, in the case of the fuse busbar being asymmetrical transversely, by turning the fusible link unit inside out for installation or changing the positions of the first busbar and the second busbar in the fusible link unit for installation therein, the change in an arrangement of the input terminal on the alternator side can be dealt with out changing the configuration of the fusible link unit.

Further, in the case of the numbers of mating terminals at the terminal ends of the electric wires and mating terminals accommodated in the connector being different, and in the case of the position of the mating terminals at the terminal ends of the electric wires and the position of the mating terminals accommodated in the connector being different, by adopting the changed fuse busbar, the change in connecting direction to the alternator, the changes in the position of the mating terminals at the terminal ends of the electric wires and the position of the mating terminals accommodated in the connector and the changes in the numbers of mating terminals at the terminal ends of the electric wires and mating terminals accommodated in the connector can be dealt with out changing the configuration of the fusible link unit.

Consequently, the change in the arrangement of the input terminal from the alternator due to conditions on the vehicle side can be dealt with by the configuration of the one type of fusible link unit 1, thereby making it possible to realize a reduction in production cost.

Also, according to the above configuration, the slits are formed individually in the first and second busbars so as to enable the first and second connecting portions to be bent relative to the conductive portions. Here, since the second busbar of the fusible link unit is locked in the relay box in such a state that the second busbar is connected with an alternator side terminal by a bolt or the like within the relay box, the input side connecting portion of the fuse busbar is bent so as to be locked with the relay box together with the alternator side terminal within the relay box. In addition, in the case of the fuse busbar being symmetrical transversely, for a change in the arrangement of the input terminal on the alternator side, the bending direction of the input connecting portion of the second busbar which projects outwards from the side portion of the housing is changed by the slit which enables the input connecting portion of the second busbar to be bent relative to the conductive portion thereof. By doing so, the change in the arrangement of the input terminal on the alternator side can be dealt with out changing the configuration of the fusible link unit.

According to the above configuration, the output terminal connecting portions include the terminal connecting portions which are connected to the mating terminals and the connector connecting portions. The housing includes the terminal supporting portions where the terminal connecting portions are connected to the mating terminals and the connector opening portion in which the connector fits which accommodates the mating terminals to which the connector connecting portions. By adopting this configuration, in the case of the fuse busbar being asymmetrical transversely, by changing the positions of the first busbar and the second busbar in the fusible link unit for installation therein, the change in the arrangement of the input terminal on the alternator side can be dealt with out changing the configuration of the fusible link unit.

According to the above configuration, the locking portion is provided on the housing which is adapted to be locked on the inner wall of the relay box in which the housing is accommodated. By adopting this configuration, in the case of the fuse busbar being asymmetrical transversely, by turning the fusible link unit inside out for installation, the change in input direction on the alternator side can be dealt with out changing the configuration of the fusible link unit.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF EXEMPLARY EMBODIMENTS

Figure 1:
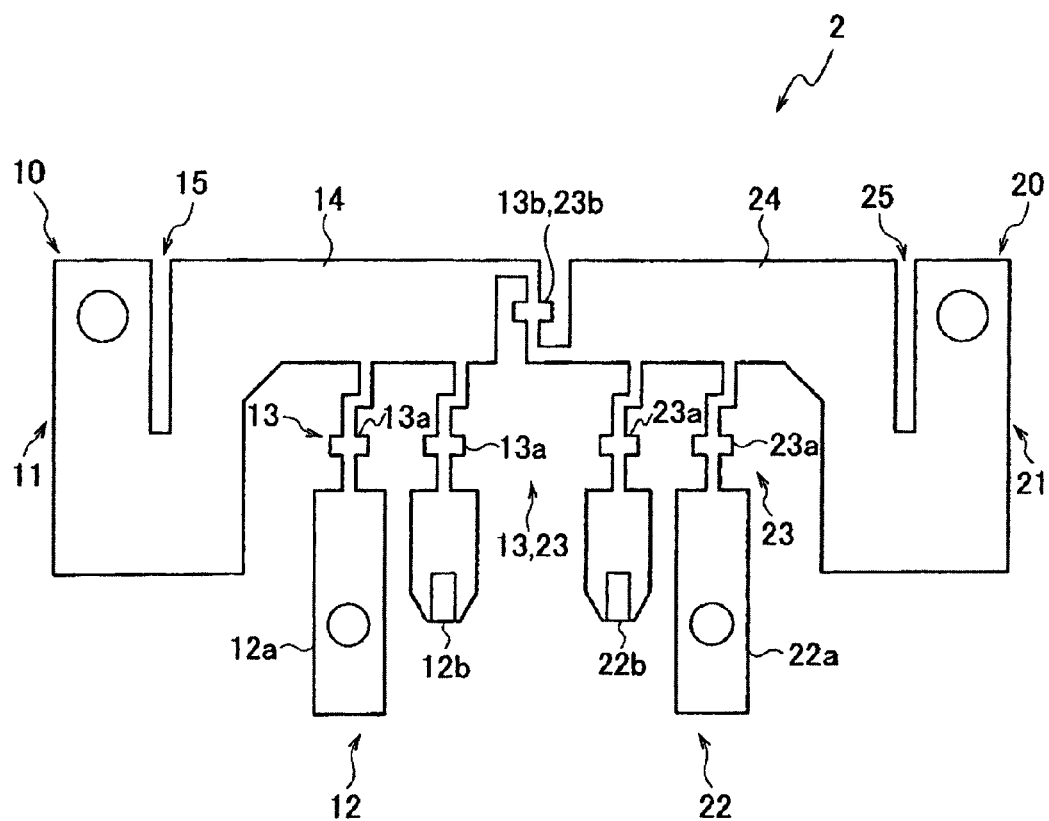
FIG. 1 is a front view of a fuse busbar which makes up a fusible link unit according to a first embodiment of the invention.
Figure 2A:
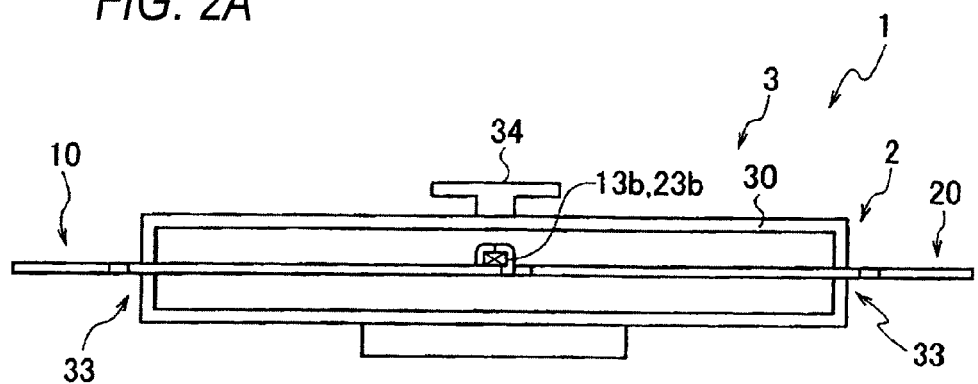
FIGS. 2A and 2B are a plan view and a front view of the fusible link unit according to the first embodiment of the invention.
Figure 2B:
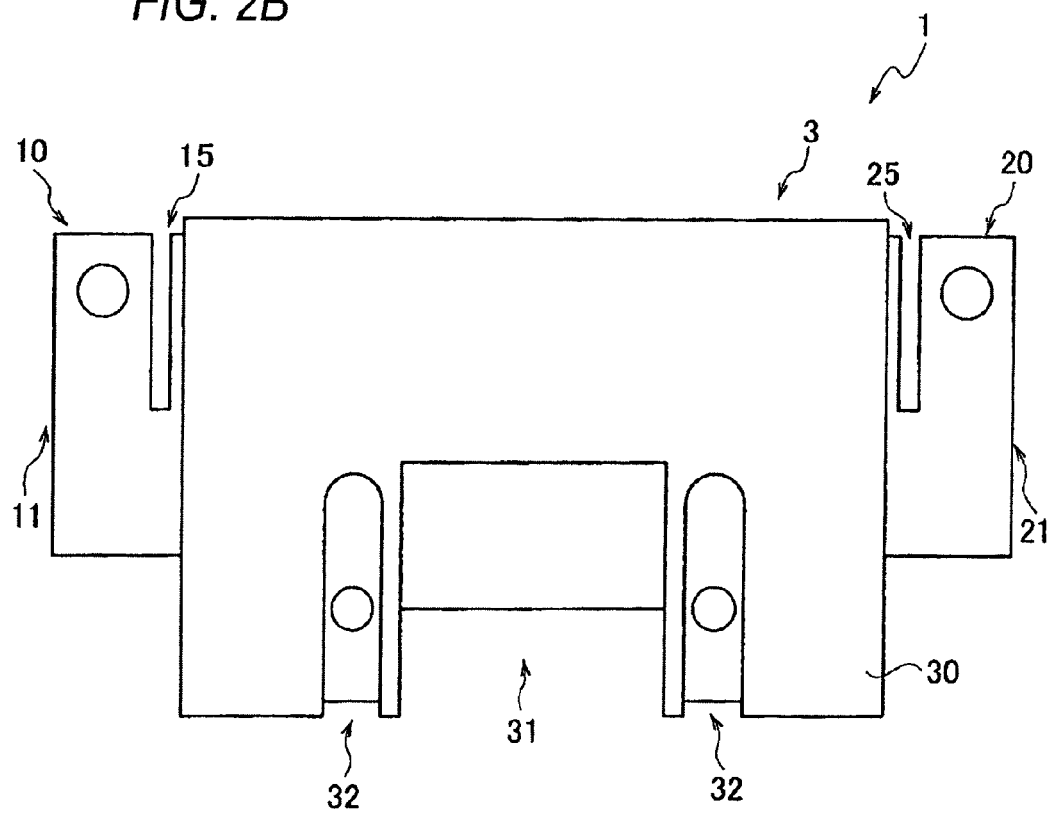
Figure 3:
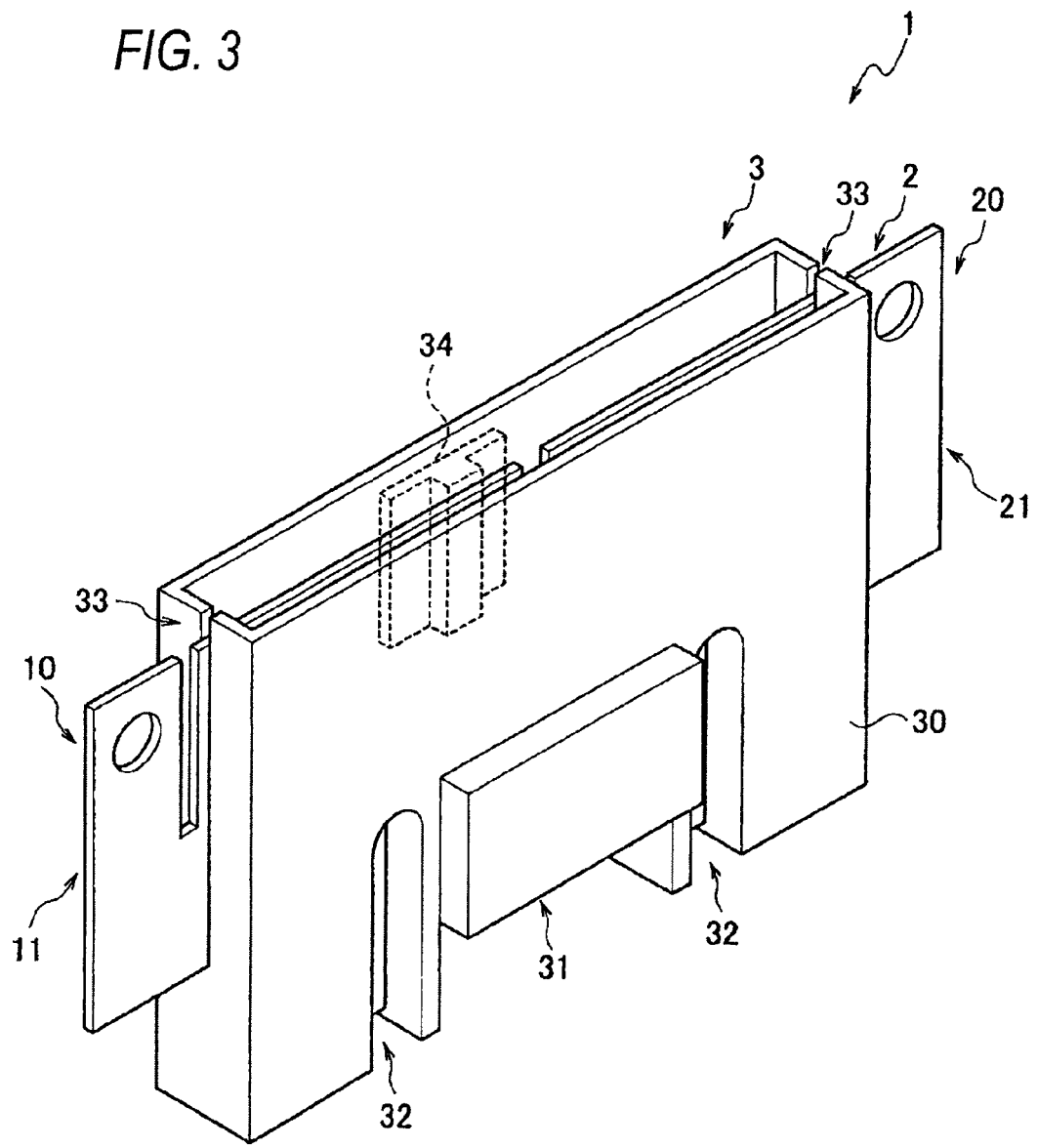
FIG. 3 is a perspective view of the fusible link unit according to the first embodiment of the invention.
Figure 4:
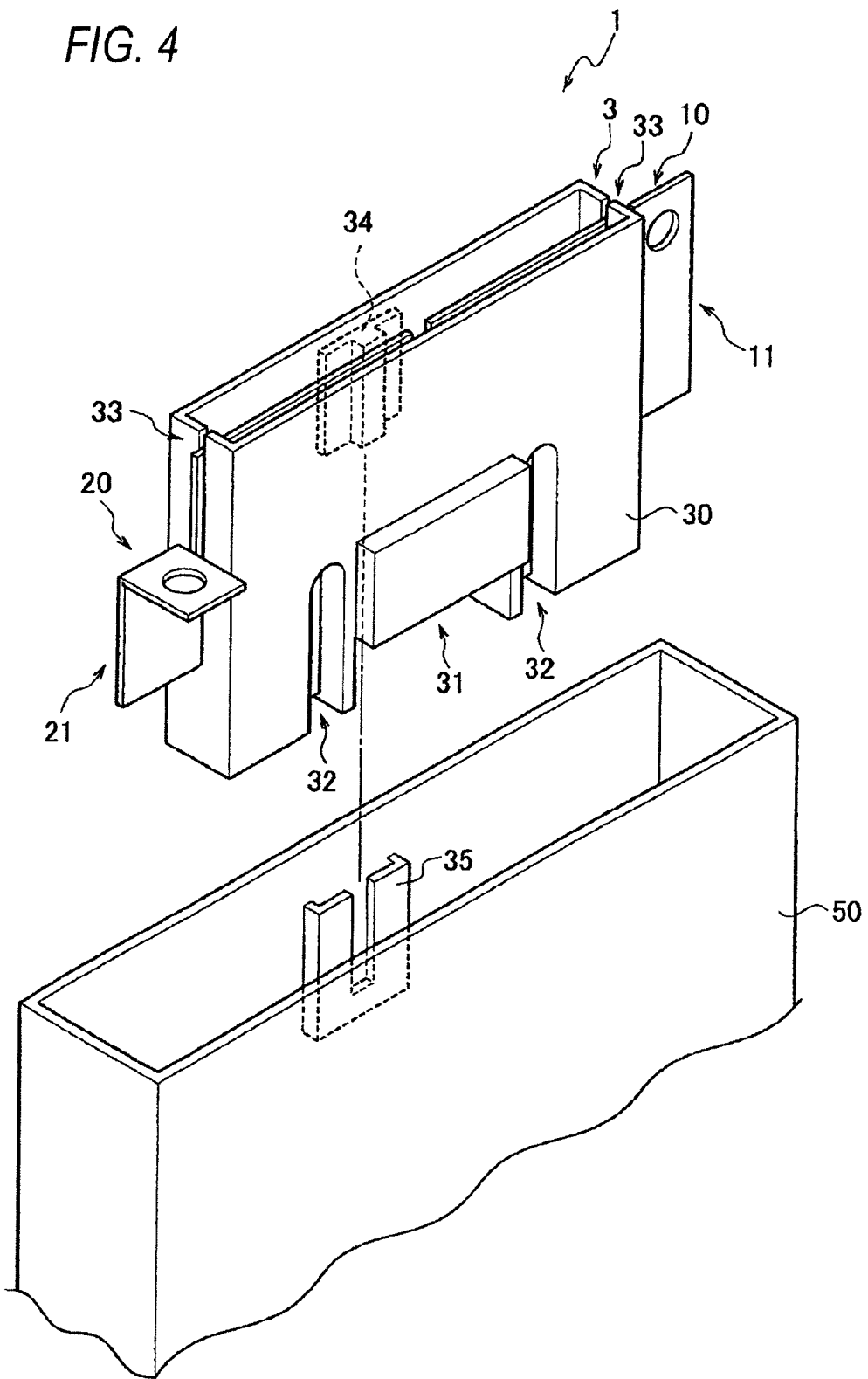
FIG. 4 is a perspective view showing the fusible link unit and a relay box according to the first embodiment of the invention.
Figure 5:
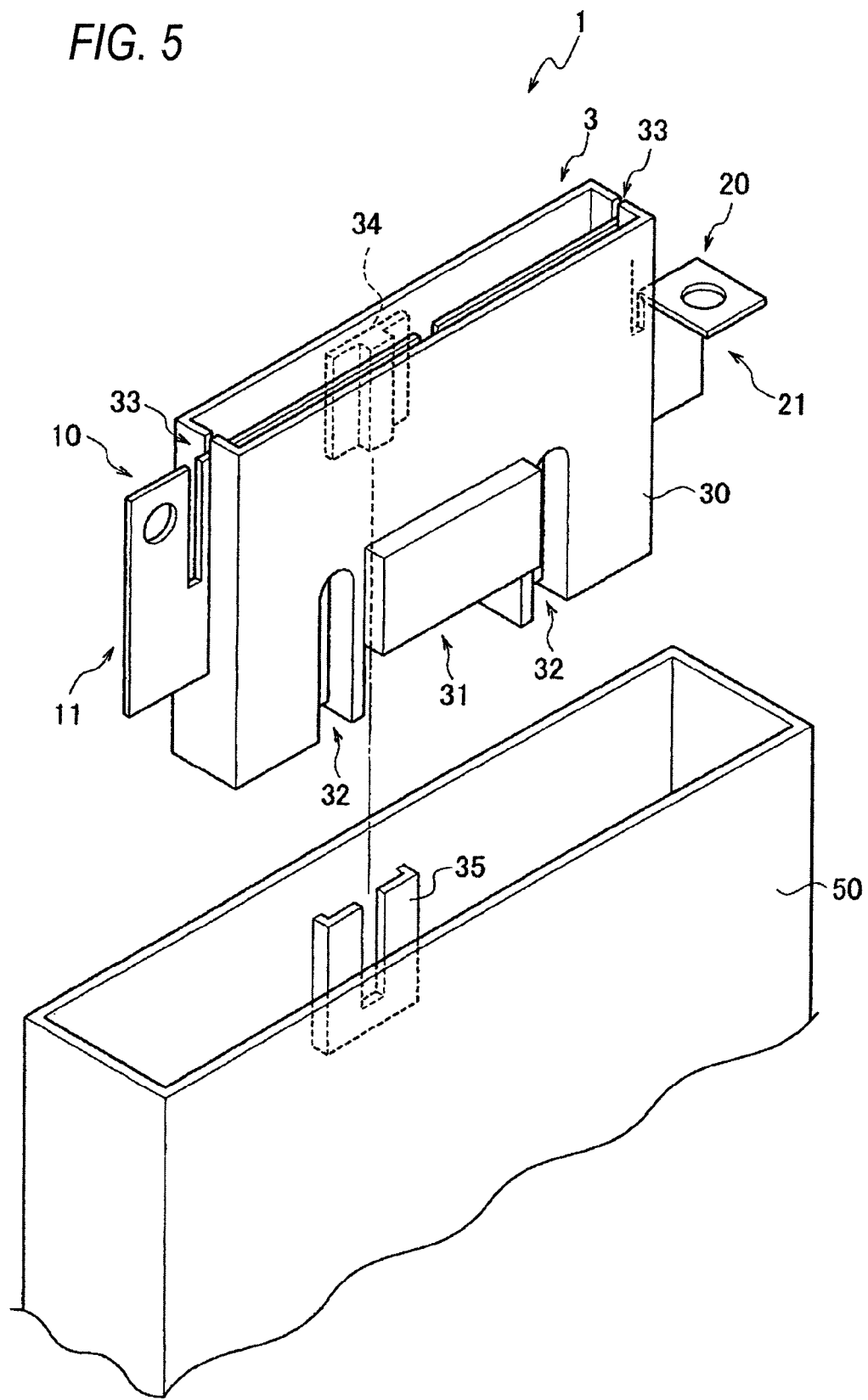
FIG. 5 is a perspective view showing the fusible link unit and the relay box according to the first embodiment of the invention.

Hereinafter, a first embodiment of the invention will be described by reference to the drawings. FIGS. 1 to 5 show the first embodiment of the invention. FIG. 1 is a front view of a fuse busbar which makes up a fusible link unit according to the first embodiment of the invention. FIG. 2A is a plan view of the fusible link unit according to the first embodiment of the invention. FIG. 2B is a front view of the fusible link unit. FIG. 3 is a perspective view of the fusible link unit. FIGS. 4 and 5 are perspective views of the fusible link unit and a relay box.

As shown in FIGS. 1 to 5, a fusible link unit 1 includes a fuse busbar 2 which is made of a metallic plate which can conduct electricity and a housing 3 which is formed through injection molding by use of an insulating synthetic resin material into a shape which is transversely symmetrical.

As shown in FIG. 1, the fuse busbar 2 according to the first embodiment of the invention includes a battery side fuse busbar (a first busbar) 10 which conducts a current from the battery side and an alternator side fuse busbar (a second busbar) 20 which conducts a current from the alternator side. The battery side fuse busbar 10 and the alternator side fuse busbar 20 include input connecting portions 11, 21, output connecting portions 12, 22 and fusible elements 13, 23 respectively.

The battery side busbar 10 and the alternator side fuse busbar 20 are connected to each other via the input connecting portions 11, 21, the output connecting portions 12, 22 and the fusible elements 13, 23. Currents are input to the input connecting portions 11, 21. The currents are output from the output connecting portions 12, 22. The fusible elements 13, 23, each having a crank-shape, are adapted to melt down when an overcurrent of a predetermined value is conducted therethrough to interrupt electric communications between the input connecting portions 11, 21 and the output connecting portions 21, 22.

The output connecting portion 12 of the battery side fuse busbar 10 and the output connecting portion 22 of the alternator side fuse busbar 20 include terminal connecting portions 12a, 22a and connector connecting portions 12b, 22b respectively. The terminal connecting portions 12a, 22a are connected to mating terminals at terminal ends of corresponding electric wires. The connector connecting portions 12b, 22b are connected to mating terminals which are accommodated in a connector. The terminal connecting portions 12a, 22a and the connector connecting portions 12b, 22b are configured so as to be symmetrical transversely. In addition, the fusible element 13 of the battery side fuse busbar 10 and the fusible element 23 of the alternator side fuse busbar 20 include terminal fusible elements 13a, 23a which are adapted to melt down when a current of a predetermined value is conducted therethrough to interrupt electric communications between the input connecting portions 11, 21 and the output connecting portions 12, 22 and inter-conductive portion fusible elements 13b, 23b which are adapted to melt down when a current of a predetermined value is conducted therethrough to interrupt an electric communication between conductive portions of the battery side fuse busbar 10 and the alternate side fuse busbar 20.

Further, the fuse busbar 2 includes a battery side conductive portion 14 which is a conductive portion of the battery side fuse busbar 10 and a battery side slit 15 which enables the input connecting portion 11 to be bent relative to the battery side conductive portion 14. In addition, the fuse busbar 2 includes an alternator side conductive portion 24 which is a conductive portion of the alternator side fuse busbar 20 and an alternator side slit 25 which enables the input connecting portion 21 to be bent relative to the alternator side conductive portion 24.

The fuse busbar 2, in which the terminal connecting portions 12a, 22a and the connector connecting portions 12b, 22b are configured so as to be symmetrical transversely, is mounted in the housing 3 as shown in FIGS. 2A to 3. The housing 3 has a substantially a rectangular parallelepiped shape and is formed so as to be symmetrical transversely. The housing 3 includes a housing main body 30 which is opened upwards, a connector opening portion 31 into which the connector connecting portions 12b, 22b are inserted so that a mating connector containing mating terminals is fitted into the connector opening portion 31, and terminal supporting portions 32 into which the terminal connecting portions 12a, 21a are inserted. In addition, input connecting portion inserting slits 33 (inserting hole portions) are provided in both end portions of the housing 3 from which the input connecting portions 11, 21 of the battery side fuse busbar 10 and the alternator side fuse busbar 20 are allowed to project in a state that the fuse busbar 2 is embedded or accommodated in the housing 3. A housing side locking portion 34 is provided on a back side of the housing main body 30.

As shown in FIG. 4, the housing 3 is installed in a locked fashion in a relay box 50 where the fusible link unit 1 is to be accommodated by the housing side locking portion 34 which is provided on the back side of the housing main body 30 being locked into a relay box side locking portion 35 which is provided on an inner wall of the relay box 50.

Here, since the alternator side fuse busbar 20 is locked in the relay box 50 in such a state that the alternator side fuse busbar 20 is connected with an alternator side terminal by a bolt or the like within the relay box 50, the input side connecting portion 21 of the fuse busbar 20 is bent so as to be locked with the relay box 50 together with the alternator side terminal within the relay box 50.

Consequently, in the case that an alternator side input is arranged on a right-hand side of the relay box 50 in a vehicle, as shown in FIG. 4, the input connecting portion 21 of the fuse busbar 20 which projects outwards from a right-hand side portion of the housing 3 is bent substantially at right angles via the alternator side slit 25, so as to be locked with the relay box 50 together with the alternator side terminal within the relay box 50.

In addition, in the case that an alternator side input is arranged on a left-hand side of the relay box 50 in a vehicle, as shown in FIG. 1, the fuse busbar 2 is configured so that the terminal connecting portions 12a, 22a which are connected to mating terminals at terminal ends of corresponding electric wires and the connector connecting portions 12b 22b which are connected to mating terminals accommodated in a connector are disposed symmetrical transversely. Because of this, as shown in FIG. 5, the input connecting portion 21 of the fuse busbar 20 which projects outwards from a left-hand side portion of the housing 3 is bent substantially at right angles via the alternator side slit 25, so as to be locked with the relay box 50 together with the alternator side terminal within the relay box 50. In this way, by bending the input connection portion 21 of the alternator side fuse busbar so as to match the input direction (an arrangement of an input terminal in the vehicle) on the alternator side, the difference in input direction from the alternator can be dealt with the same fusible link unit 1.

In this way, the fusible link unit 1 according to the first embodiment is the fusible link unit 1 which is formed by connecting the battery side conductive portion 14 and the alternator side conductive portion 24 together via the battery side fusible element 13 and the alternator side fusible element 23 which can melt down when a current of a predetermined value is conducted therethrough. The battery side input connecting portion 11 and the alternator side input connecting portion 21 are formed into the same shape. The input connecting portion inserting slits 33 are provided in the end portions of the housing 3 from which the battery side input connecting portion 11 and the alternator side input connecting portion 21 are allowed to project outwards in such a state that the fuse busbar 2 is embedded or accommodated in the housing 3. The fusible link unit 1 is formed so that the housing 3 becomes symmetrical transversely in such a state that the battery side fuse busbar 10 and the alternator side fuse busbar 21 are embedded or accommodated in the housing 3 and the battery side input connecting portion 11 and the alternator side input connecting portion 21 are allowed to project outwards from both the side portions of the housing 3. By this configuration, in the case of the fuse busbar 2 being symmetrical transversely, in the event that the input direction on the alternator side is changed, by changing a portion where the alternator side input connecting portion 21 which projects outward from the side portion of the housing 3 is bent, the change in input direction (an arrangement of the input terminal) on the alternator side can be dealt with out changing the configuration of the fusible link unit 1.

In addition, in the fusible link unit 1 according to the first embodiment of the invention, the battery side slit 15 and the alternator side slit 25 are formed in the battery side input connecting portion 11 and the alternator side input connecting portion 21, respectively, which project outwards from both the side portions of the housing 3, by which the input connecting portions 11, 21 can be bent relative to the battery side conductive portion 14 and the alternator side conductive portion 24, respectively. Here, since the battery side fuse busbar of the fusible link unit 1 is locked in the relay box in such a state that the battery side fuse busbar is connected with an alternator side terminal with a bolt or the like within the relay box, the input connecting portion of the fuse busbar has to be bent so as to be locked in the relay box together with the alternator side terminal. In addition, in the case of the fuse busbar 2 being symmetrical transversely, in the event that the input direction from the alternator is changed, the bending direction is changed by the alternator side slit 25 which enables the alternator side input connecting portion 21 which projects outwards from the side portion of the housing 3 to be bent relative to the alternator side conductive portion 24. By doing so, the change in input direction on the alternator side can be dealt with out changing the configuration of the fusible link unit 1.

Figure 6:
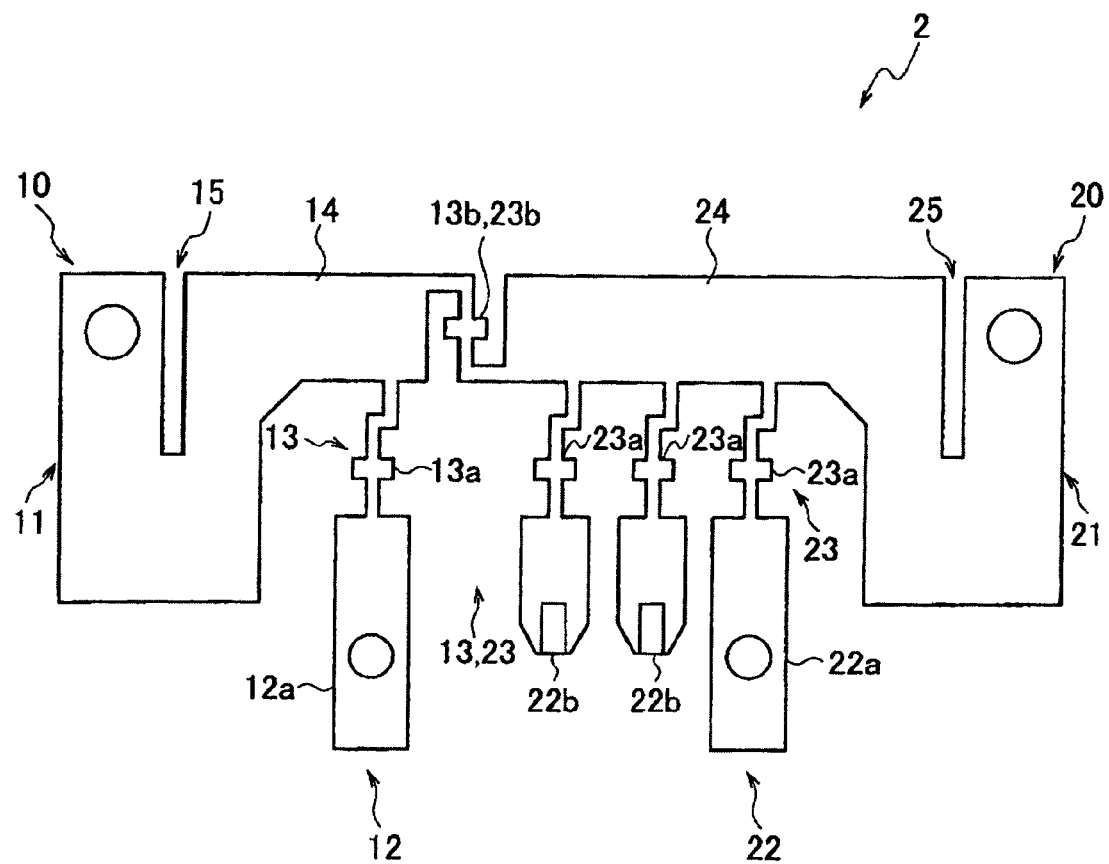
FIG. 6 is a front view of a fuse busbar which makes up a fusible link unit according to a second embodiment of the invention.
Figure 7:
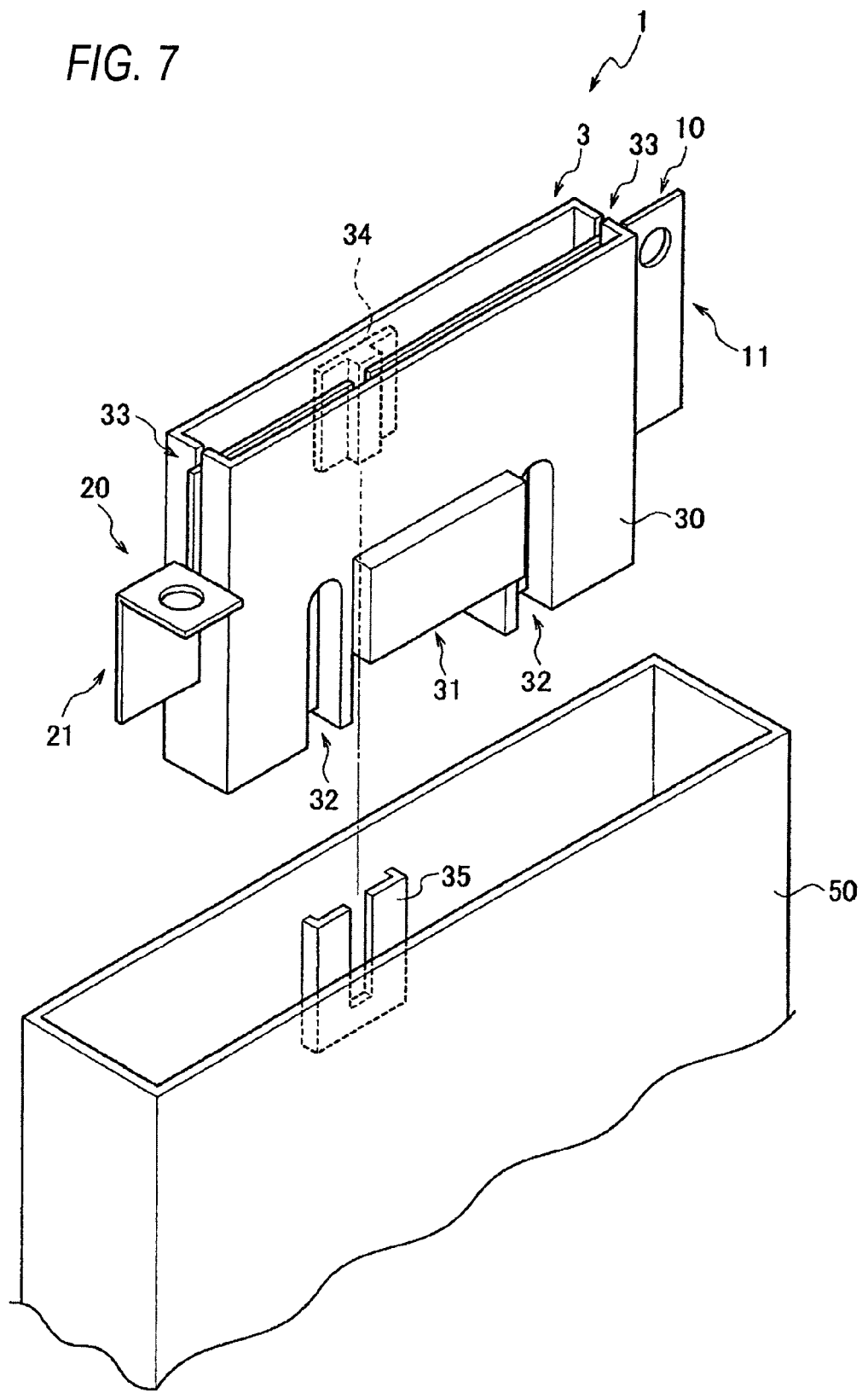
FIG. 7 is a perspective view showing the fusible link unit and a relay box according to the second embodiment of the invention.
Figure 8:
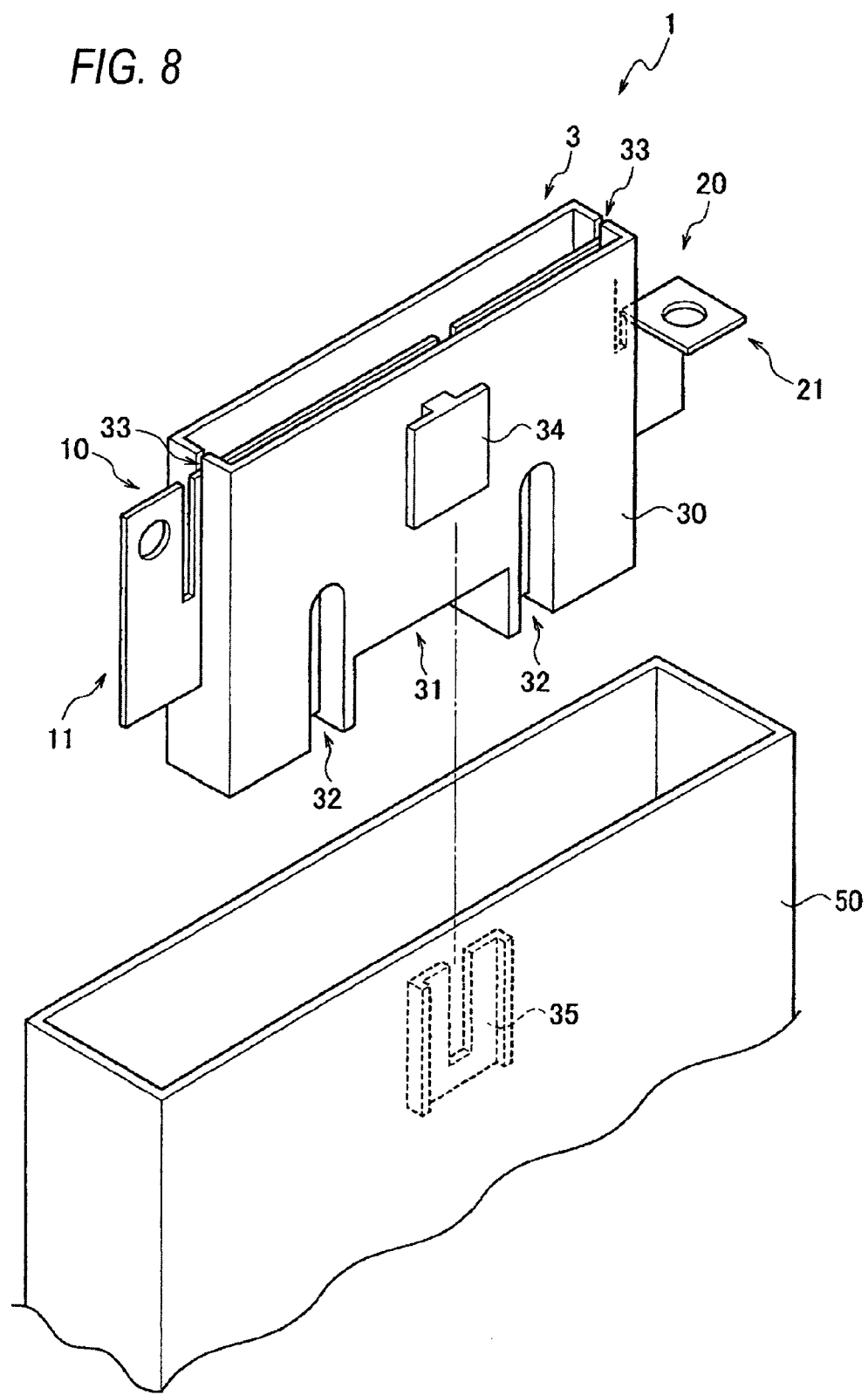
FIG. 8 is a perspective view showing the fusible link unit and the relay box according to the second embodiment of the invention.

Next, a second embodiment of the invention will be described by reference to the drawings. FIGS. 6 to 8 show a second embodiment of the invention, and the second embodiment of the invention will be described by giving like reference numerals to like constituent portions to those of the first embodiment so as to omit the repetition of the same description. FIG. 6 is a front view of a fuse busbar which constitutes a fusible link unit according to the second embodiment of the invention. FIGS. 7 and 8 are perspective views of the fusible link unit and a relay box.

As shown in FIG. 6, an output connecting portion 12 of a battery side fuse busbar 10 has a terminal connecting portion 12a which is connected to a mating terminal at a terminal end of a corresponding electric wire. An output connecting portion 22 of an alternator side fuse busbar 20 has a terminal connecting portion 22a which is connected to a mating terminal at a terminal end of a corresponding electric wire and connector connecting portions 22b which are connected to mating terminals accommodated in a connector. In addition, a fusible element 13 of the battery side fuse busbar 10 and a fusible element 23 of the alternator side fuse busbar 20 include terminal fusible elements 13a, 23a which are adapted to melt down when a current of a predetermined value is conducted therethrough to interrupt electric communications between the input connecting portions 11, 21 and the output connecting portions 12, 22 and inter-conductive portion fusible elements 13b, 23b which are adapted to melt down when a current of a predetermined value is conducted therethrough to interrupt an electric communication between conductive portions of the battery side fuse busbar 10 and the alternate side fuse busbar 20 in a transversely asymmetrical fashion.

In the fuse busbar 2, the terminal connecting portions 12a, 22a and the connector connecting portions 22b are configured transversely asymmetrical. The fuse busbar 2 is installed in a housing 3 as shown in FIGS. 7 and 8. The housing 3 is installed in a locked fashion in a relay box 50 where the fusible link unit 1 is to be accommodated by a housing side locking portion 34 which is provided on a back side of a housing main body 30 being locked into a relay box side locking portion 35 which is provided on an inner wall of the relay box 50.

Here, in the case that an alternator side input is arranged on a left-hand side of the relay box 50 in a vehicle, as shown in FIG. 7, the input connecting portion 21 of the alternator side fuse busbar which projects outwards from a right-hand side portion of the housing 3 is bent substantially at right angles via an alternator side slit 25, so as to be locked with the relay box 50 together with an alternator side terminal within the relay box 50.

In the case that an alternator side input arranged on a right-hand side of the relay box 50 in a vehicle, in the fuse busbar 2, the terminal connecting portions 12a, 22a which are adapted to be connected to mating terminals at terminal ends of corresponding electric wires and the connector connecting portions 22b which are adapted to be connected to mating terminals accommodated in a connector are configured asymmetrical transversely. Because of this, as shown in FIG. 8, the fusible link unit 1 is turned inside out and is then installed in a locked fashion in the relay box 50 where the fusible link unit 1 is to be accommodated by the housing side locking portion 34 which is provided on the back side of the housing main body 30 being locked into the relay box side locking portion 35 which is provided on the inner wall of the relay box 50.

Then, by bending the input connecting portion 21 of the alternator side fuse busbar which projects outwards from the right-hand side portion of the housing 3 in an opposite direction to the direction shown in FIG. 7, the change in input direction from the alternator can be dealt with out changing the configuration of the fusible link unit 1.

In this way, in the fusible link unit 1 according to the second embodiment of the invention, in the case of the fuse busbar 2 being transversely asymmetrical, by turning the fusible link unit 1 inside out for installation in the relay box 50, the change in input direction from the alternator can be dealt with out changing the configuration of the fusible link unit 1. Consequently, the change in input direction from the alternator due to conditions on the vehicle side can be dealt with by the configuration of the one type of fusible link unit 1, thereby making it possible to realize a reduction in production cost.

Figure 9:
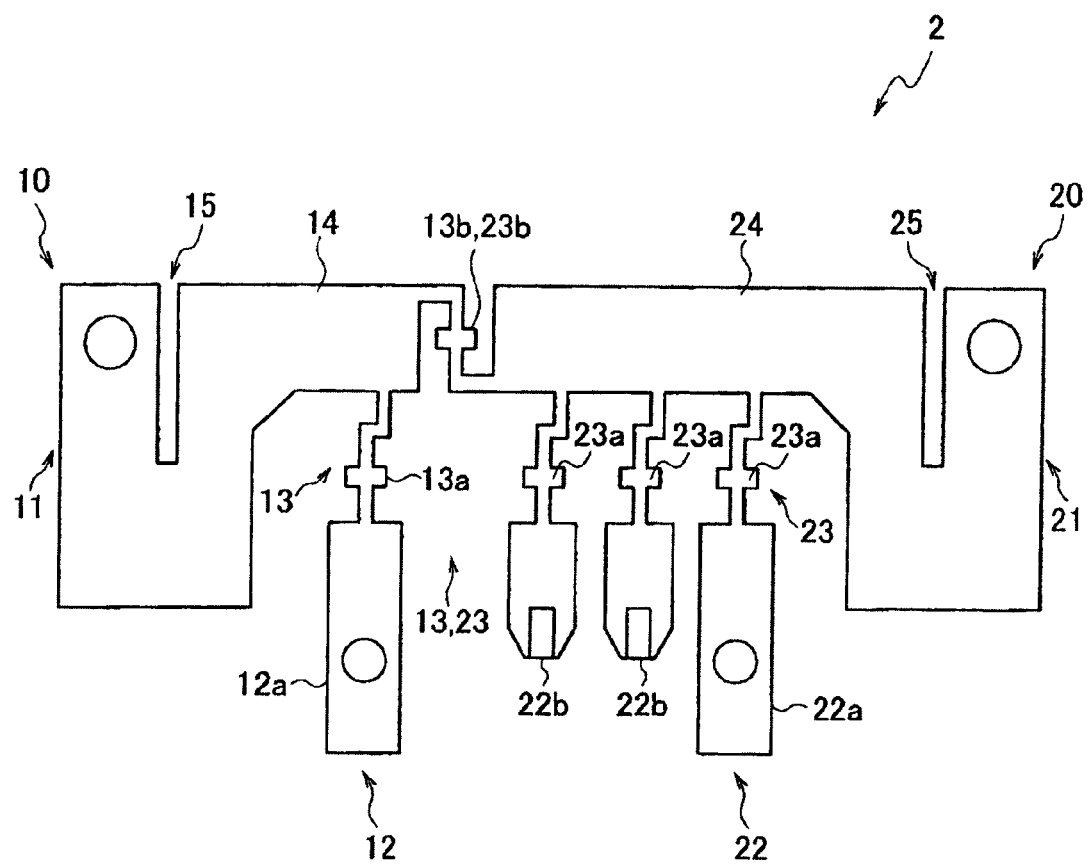
FIG. 9 is a front view of a fuse busbar which makes up a fusible link unit according to a third embodiment of the invention.
Figure 10:
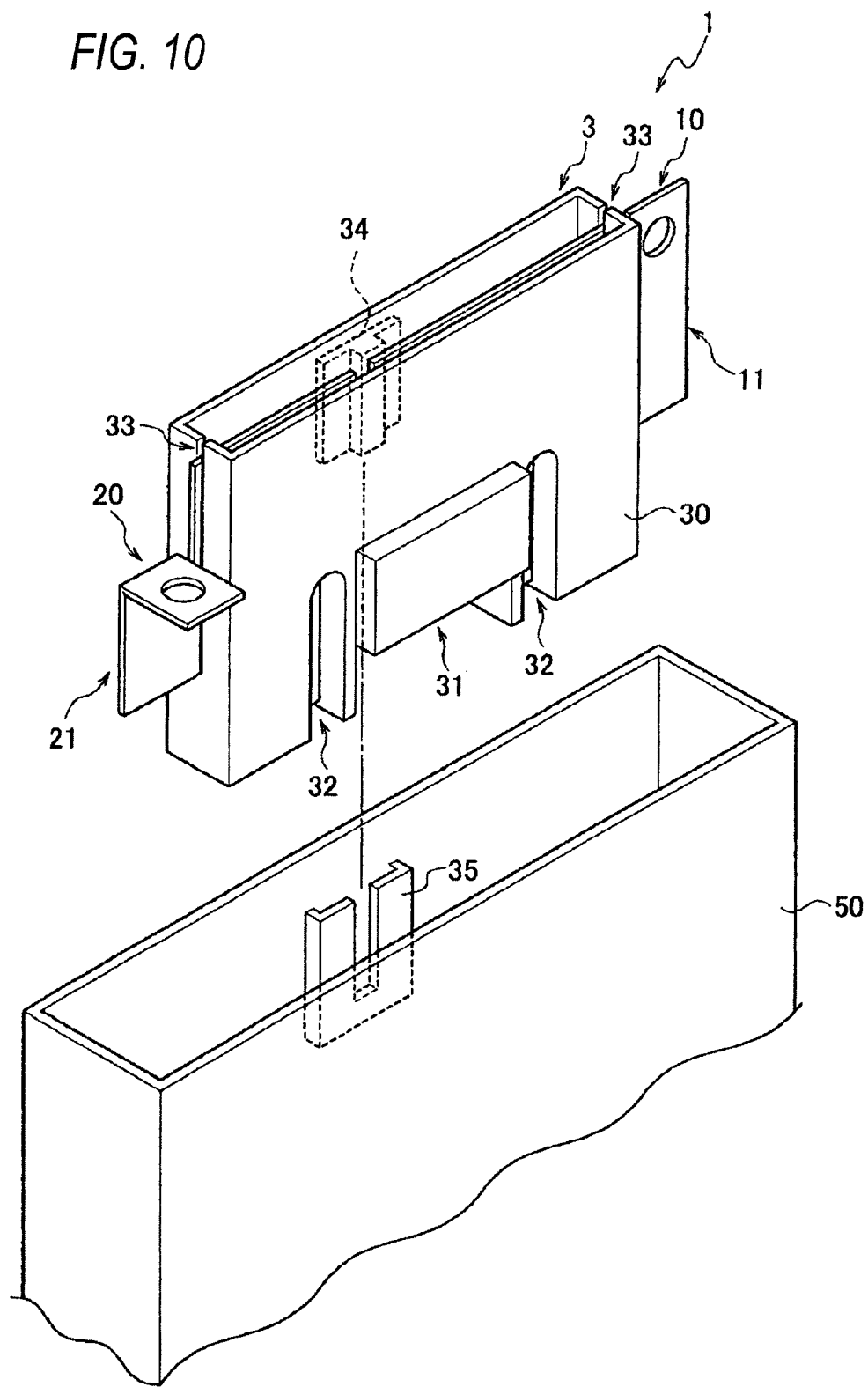
FIG. 10 is a perspective view showing the fusible link unit and a relay box according to the third embodiment of the invention.
Figure 11:
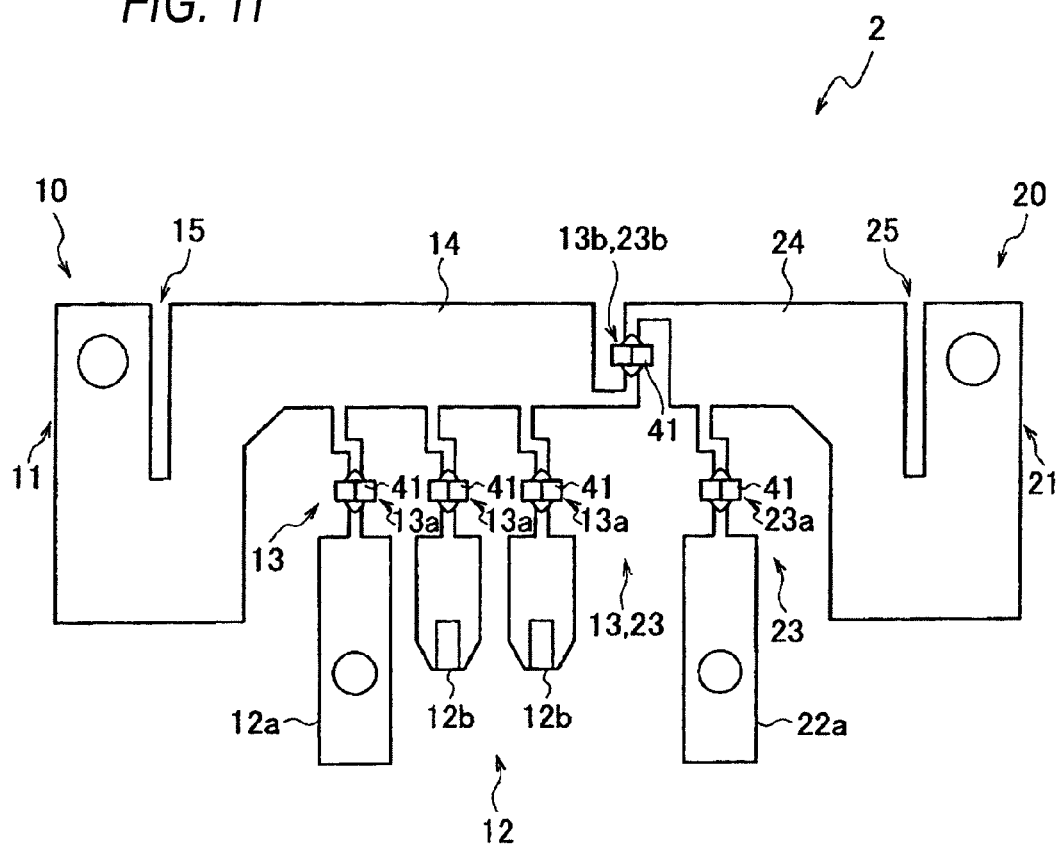
FIG. 11 is a front view of a fuse bus bar which makes up the fusible link unit according to the third embodiment of the invention.
Figure 12:
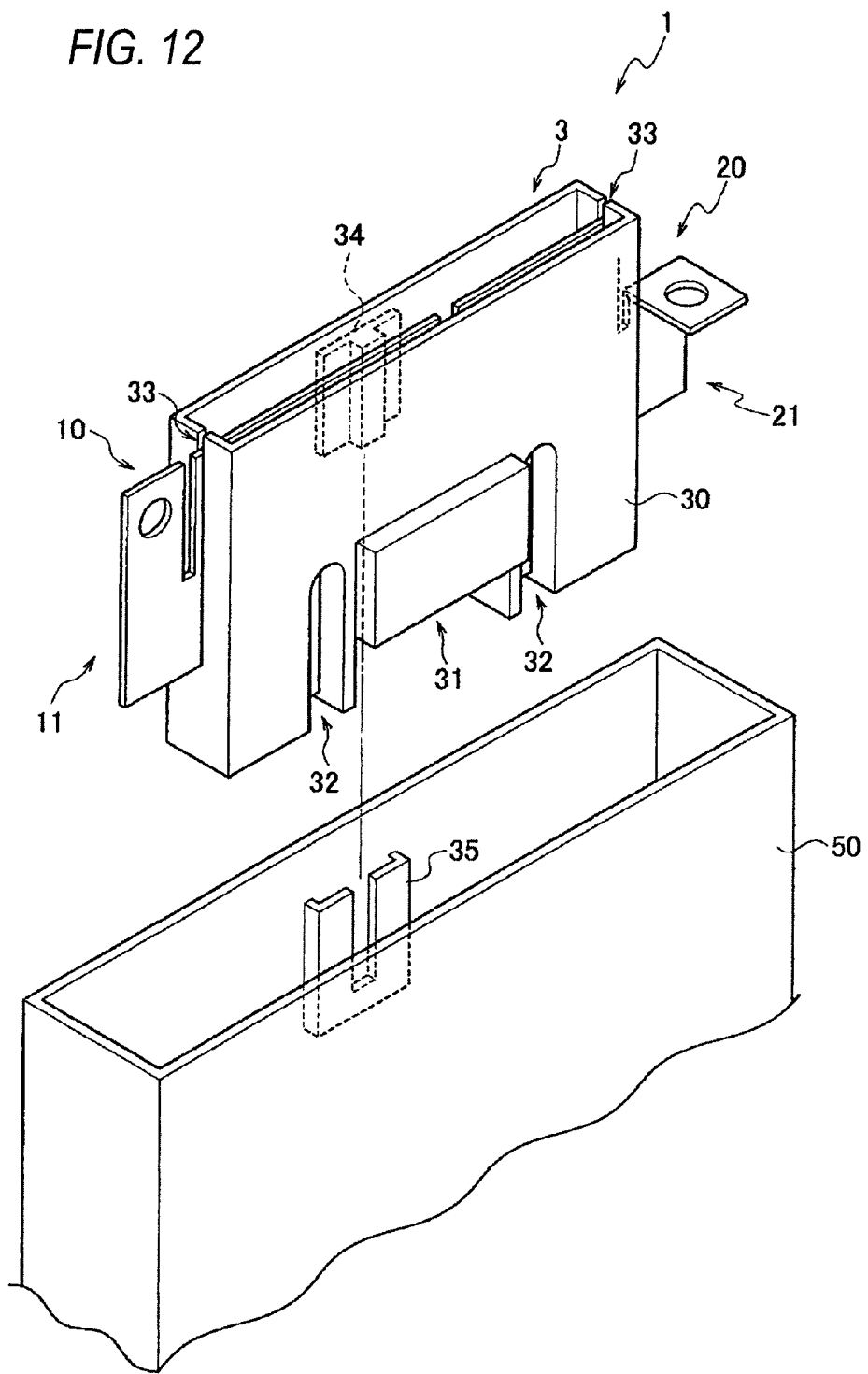
FIG. 12 is a perspective view showing the fusible link unit and the relay box according to the third embodiment of the invention.

Next, a third embodiment of the invention will be described by reference to the drawings. FIGS. 9 to 12 show a third embodiment of the invention, and the third embodiment of the invention will be described by giving like reference numerals to like constituent portions to those of the first embodiment so as to omit the repetition of the same description. FIG. 9 is a front view of a fuse busbar which makes up a fusible link unit according to the third embodiment of the invention. FIG. 10 is a perspective view of the fusible link unit and a relay box according to the third embodiment. FIG. 11 is a front view of a fuse busbar which make up the fusible link unit according to the third embodiment of the invention. FIG. 12 is a perspective view of the fusible link unit and the relay box according to the third embodiment of the invention.

As shown in FIG. 9, an output connecting portion 12 of a battery side fuse busbar 10 includes a terminal connecting portion 12a which is connected to a mating terminal at a terminal end of a corresponding electric wire. An output connecting portion 22 of an alternator side fuse busbar 20 includes a terminal connecting portion 22a which is connected to a mating terminal at a terminal end of a corresponding electric wire and connector connecting portions 22b which are connected to mating terminals accommodated in a connector. In addition, a fusible element 13 of the battery side fuse busbar 10 and a fusible element 23 of the alternator side fuse busbar 20 include terminal fusible elements 13a, 23a which are adapted to melt down when a current of a predetermined value is conducted therethrough to interrupt electric communications between the input connecting portions 11, 21 and the output connecting portions 12, 22 and inter-conductive portion fusible elements 13b, 23b which are adapted to melt down when a current of a predetermined value is conducted therethrough to interrupt an electric communication between conductive portions of the battery side fuse busbar 10 and the alternate side fuse busbar 20 in a transversely asymmetrical fashion.

In the fuse busbar 2, the terminal connecting portions 12a, 22a and the connector connecting portions 22b are configured transversely asymmetrical. The fuse busbar 2 is installed in a housing 3 as shown in FIG. 10. The housing 3 is installed in a locked fashion in a relay box 50 where the fusible link unit 1 is to be accommodated by a housing side locking portion 34 which is provided on a back side of a housing main body 30 being locked into a relay box side locking portion 35 which is provided on an inner wall of the relay box 50.

Here, in the case that an alternator side input is arranged on a left-hand side of the relay box 50 in a vehicle, as shown in FIG. 11, the input connecting portion 21 of the alternator side fuse busbar which projects outwards from a right-hand side portion of the housing 3 is bent substantially at right angles via an alternator side slit 25, so as to be locked with the relay box 50 together with an alternator side terminal within the relay box 50.

In the case that an alternator side input is arranged on a right-hand side of the relay box 50 in a vehicle, a fuse busbar is changed to a fuse busbar 2 as shown in FIG. 11. The fuse busbar 2 is adopted in which terminal connecting portions 12a, 22a and connector connecting portions 12b are configured asymmetrical transversely which deal with the number of mating terminals at terminal ends of electric wires, the number of mating terminals which are accommodated in a connector and the position of the mating terminals at the terminal ends of electric wires and the position of the mating terminals accommodated in the connector.

Namely, in the case of the number of mating terminals at terminal ends of electric wires and the number of mating terminals accommodated in a connector being changed and the position of the mating terminals at the terminal fuse busbar is changed, and a fuse busbar 2 is adopted which deal with the number of mating terminals at terminal ends of electric wires, the number of mating terminals which are accommodated in a connector and the position of the mating terminals at the terminal ends of electric wires and the position of the mating terminals accommodated in the connector and is locked with the relay box 50 together with an alternator side terminal within the relay box 50.

As shown in FIG. 12, the changed fuse busbar 2 is installed in the housing 3, and the housing 3 is installed in a locked fashion in the relay box 50 where the fusible link unit 1 is to be accommodated by the housing side locking portion 34 which is provided on the back side of the housing main body 30 being locked into the relay box side locking portion 35 which is provided on the inner wall of the relay box 50. In this way, by adopting the changed fuse busbar 2, the change in connecting direction to the alternator, the changes in the numbers of mating terminals at the terminal ends of the electric wires and mating terminals accommodated in the connector and the changes in the position of the mating terminals at the terminal ends of the electric wires and the position of the mating terminals accommodated in the connector can be dealt with out changing the configuration of the housing 3.

In this way, in the fusible link unit 1 according to the third embodiment of the invention, in the case of the fuse busbar 2 being asymmetrical transversely, in the case of the numbers of mating terminals at the terminal ends of the electric wires and mating terminals accommodated in the connector being different, and in the case of the position of the mating terminals at the terminal ends of the electric wires and the position of the mating terminals accommodated in the connector being different, by adopting the changed fuse busbar 2, the change in connecting direction to the alternator, the changes in the numbers of mating terminals at the terminal ends of the electric wires and mating terminals accommodated in the connector and the changes in the position of the mating terminals at the terminal ends of the electric wires and the position of the mating terminals accommodated in the connector can be dealt with out changing the configuration of the fusible link unit 1. Consequently, the change in input direction from the alternator 2 due to conditions on the vehicle side can be dealt with by the configuration of the one type of fusible link unit 1, thereby making it possible to realize a reduction in production cost.

As shown in FIG. 11, the fusible elements 13, 23 which includes the terminal fusible elements 13*a*, 23*a* and the interconductive portion fusible elements 13*b*, 23*b* each have a narrow crank-shape, and a low melting point metal 41 is crimped to be fixed to an intermediate position along the length of the crank-shape. Thus, the respective fusible elements are designed to melt down when a current of a predetermined value or larger is conducted through the low melting point metals 41.

In this way, by the low melting point metals 41 being crimped to be fixed to the fusible elements 13, 23, there can be provided the fusible link unit 1 which can cut off an overcurrent conducted through an electric circuit so as to prevent the supply of excessive electric power to electric devices installed in the vehicle.

As in the way described above, the fusible link unit 1 according to the embodiments of the invention is the fusible link unit 1 which is formed by connecting the battery side conductive portion 14 and the alternator side conductive portion 24 together via the battery side fusible element 13 and the alternator side fusible element 23 which can melt down when a current of a predetermined value is conducted therethrough. The battery side input connecting portion 11 and the alternator side input connecting portion 21 are formed into the same shape. The input connecting portion inserting slits 33 are provided in the end portions of the housing 3 from which the battery side input connecting portion 11 and the alternator side input connecting portion 21 are allowed to project outwards in such a state that the fuse busbar 2 is embedded or accommodated in the housing 3. The fusible link unit 1 is formed so that the housing 3 becomes symmetrical transversely in such a state that the battery side fuse busbar 10 and the alternator side fuse busbar 21 are embedded or accommodated in the housing 3 and the battery side input connecting portion 11 and the alternator side input connecting portion 21 are allowed to project outwards from both the side portions of the housing 3. By this configuration, in the case of the fuse busbar 2 being symmetrical transversely, in the event that the input direction on the alternator side is changed, by changing a portion where the alternator side input connecting portion 21 which projects outward from the side portion of the housing 3 is bent, the change in input direction on the alternator side can be dealt with out changing the configuration of the fusible link unit 1.

In addition, in the case of the fuse busbar 2 being asymmetrical transversely, the change in input direction on the alternator side can be dealt with out changing the configuration of the fusible link unit 1 by turning the fusible link unit 1 inside out for installation or changing the positions of the battery side fuse busbar 10 and the alternator side fuse busbar 20 within the fusible link unit 1 for installation.

Further, in the case of the numbers of mating terminals at the terminal ends of the electric wires and mating terminals accommodated in the connector being different, and in the case of the position of the mating terminals at the terminal ends of the electric wires and the position of the mating terminals accommodated in the connector being different, by adopting the changed fuse busbar 2, the change in connecting direction to the alternator, the changes in the numbers of mating terminals at the terminal ends of the electric wires and mating terminals accommodated in the connector and the changes in the position of the mating terminals at the terminal ends of the electric wires and the position of the mating terminals accommodated in the connector can be dealt with out changing the configuration of the fusible link unit 1.

Consequently, the change in input direction from the alternator due to conditions on the vehicle side can be dealt with by the configuration of the one type of fusible link unit 1, thereby making it possible to realize a reduction in production cost.

In addition, in the fusible link unit 1 according to the embodiments of the invention, the battery side slit 15 and the alternator side slit 25 are formed in the battery side input connecting portion 11 and the alternator side input connecting portion 21, respectively, which project outwards from both the side portions of the housing 3, by which the input connecting portions 11, 21 can be bent relative to the battery side conductive portion 14 and the alternator side conductive portion 24, respectively. Here, since the battery side fuse busbar of the fusible link unit 1 is locked in the relay box in such a state that the battery side fuse busbar is connected with an alternator side terminal with a bolt or the like within the relay box, the input connecting portion of the fuse busbar has to be bent so as to be locked in the relay box together with the alternator side terminal. In addition, in the case of the fuse busbar 2 being symmetrical transversely, in the event that the input direction from the alternator is changed, the bending direction is changed by the alternator side slit 25 which enables the alternator side input connecting portion 21 which projects outwards from the side portion of the housing 3 to be bent relative to the alternator side conductive portion 24. By doing so, the change in input direction on the alternator side can be dealt with out changing the configuration of the fusible link unit 1.

Further, in the fusible link unit 1 according to the embodiments of the invention, the battery side output connecting portion 11 and the alternator side connecting portion 21 include the terminal connecting portions 12a, 22a which are connected to mating terminals at terminal ends of electric wires and connector connecting portions 12b, 22b which are connected to mating terminals accommodated in a connector. Formed in the housing 3 are the terminal supporting portions 32 where the terminal connecting portions 12a, 22a are connected to mating terminals and the connector opening portion 31 into which a connector is fitted which accommodates mating terminals to which the connector connecting portions 12b, 22b are connected. By this configuration, in the case of the fuse busbar 2 being asymmetrical transversely, by installing the battery side fuse busbar 10 and the alternator side fuse busbar 20 in the fusible link unit 1 with their positions changed, the change in input direction on the alternator side can be dealt with out changing the configuration of the fusible link unit 1.

In addition, in the fusible link unit 1 according to the embodiments of the invention, the locking portion 34 is provided on the housing 3 which is locked on the inner wall of the relay box 50 where the fusible link unit 1 is to be accommodated. By doing so, in the case of the fuse busbar 2 being asymmetrical transversely, by turning the fusible link unit 1 inside out for installation, the change in input direction on the alternator side can be dealt with out changing the configuration of the fusible link unit 1.

Thus, while the fusible link unit of the invention has been described based on the embodiments illustrated in the accompanying drawings, the invention is not limited thereto, and hence, the respective configurations of the constituent portions can be replaced by arbitrary portions which are configured so as to have similar functions.

The invention is extremely effective in realizing a reduction in production costs of a fusible link unit which cuts off an overcurrent flowing in an electric circuit.

The present application is based on Japanese Patent Application No. 2009-153794 filed on Jun. 29, 2009, the contents of which are incorporated herein by reference.

What is claimed is:

1. A fusible link unit comprising:
  a fuse busbar that includes:
  a first busbar having a first input connecting portion;
  a second busbar having a second input connecting portion; and
  a fusible element provided between the first busbar and the second busbar; and
  a housing that is provided with the fuse busbar,
  wherein the fusible element is configured to melt down when a current of a predetermined value is conducted therethrough;
  wherein the first input connecting portion and the second input connecting portion are formed into the same shape;
  wherein the first and second input connecting portions are passed through inserting holes, which are provided on both end portions of the housing, and are projected outside of the housing;
  wherein the housing is formed symmetrical transversely;
  wherein the fusible element is provided between the first input connecting portion and the second input connecting portion; and
  wherein the first busbar, the first input connecting portion, the second busbar, the second input connecting portion, and the fusible element are arranged in the substantially same plane and are also arranged on a first line at this order, a first slit extending in a direction perpendicular to the first line so as to separate the first input connecting portion and the first busbar by an airgap, and a second slit extending in a direction parallel to the first line so as to separate the second input connecting portion and the second busbar by an airgap.

2. The fusible link unit according to claim 1, wherein the first slit and the second slit are formed in the first busbar and the second busbar respectively;
  wherein the first input connecting portion is configured to be bent with respect to a conductive portion of the first busbar by the first slit; and
  wherein the second input connecting portion is configured to be bent with respect to a conductive portion of the second busbar by the second slit.

3. The fusible link unit according to claim 1, wherein the first and second busbars have output connecting portions respectively;
  wherein each of the output connecting portions includes:
  a terminal connecting portion which is connected to a mating terminal; and
  a connector connecting portion which is connected to a mating terminal accommodated in a connector; and
  wherein the housing includes:
  a terminal supporting portion into which the terminal connecting portion is inserted; and
  a connector opening portion which is fitted with the connector accommodating the mating terminal.

4. The fusible link unit according to claim 1, wherein the housing has a locking portion which is adapted to be locked on an inner wall of a relay box in which the housing is accommodated.

5. The fusible link unit according to claim 1, wherein the fuse busbar is contained in the housing.

6. The fusible link unit according to claim 1, wherein the fuse busbar is embedded in the housing.

7. The fusible link unit according to claim 1, wherein the first busbar extends from the fusible element in a first direction and the second busbar extends from the fusible element in a second direction being opposite to the first direction.

8. The fusible link unit according to claim 7, wherein the first input connecting portion is provided at one end portion of the first busbar which is opposite to the other end of the first busbar near the fusible element in the first direction; and
  wherein the second input connecting portion is provided at one end portion of the second busbar which is opposite to the other end of the first busbar near the fusible element in the second direction.

* * * * *